United States Patent [19]

Cho et al.

[11] 4,201,998
[45] May 6, 1980

[54] DEVICES WITH SCHOTTKY METAL CONTACTS FILLING A DEPRESSION IN A SEMI-CONDUCTOR BODY

[75] Inventors: Alfred Y. Cho, Summit; Martin V. Schneider, Holmdel, both of N.J.

[73] Assignee: Bell Telephone Laboratories, Incorporated, Murray Hill, N.J.

[21] Appl. No.: 910,118

[22] Filed: May 30, 1978

Related U.S. Application Data

[62] Division of Ser. No. 770,014, Feb. 18, 1977, Pat. No. 4,108,738.

[51] Int. Cl.$^2$ ............................................. H01L 29/48
[52] U.S. Cl. ...................................... 357/15; 357/52; 357/55
[58] Field of Search ........................... 357/15, 55, 52

[56] References Cited

U.S. PATENT DOCUMENTS

| | | | |
|---|---|---|---|
| 2,846,346 | 8/1958 | Bradley | 204/129.65 |
| 3,397,450 | 8/1968 | Bittmann et al. | 357/15 |
| 3,476,984 | 11/1969 | Tibol | 357/15 |
| 3,623,925 | 11/1971 | Jenkins et al. | 357/15 |
| 3,636,417 | 1/1972 | Kimura | 357/15 |
| 4,075,652 | 2/1978 | Umebachi et al. | 357/15 |

OTHER PUBLICATIONS

R. Warner et al., "Integrated Circuits-Design Prin. and Fab.," McGraw-Hill, 1965, Motorola, TK7870M63, p. 73.
P. Stiles et al., "Schottky Barrier Diode," IBM Tech. Discl. Bull., vol. 11, #1, Jun. 1968, p. 20.
S. Magdo et al., "High-Speed Epitaxial Field-Effect Devices," IBM Tech. Discl. Bull., vol. 14, #3, Aug. 1971, p. 751.

*Primary Examiner*—Joseph E. Clawson, Jr.
*Attorney, Agent, or Firm*—Michael J. Urbano

[57] ABSTRACT

A Schottky barrier semiconductor device and process for making same is described wherein edge breakdown is avoided by making the rectifying contact in a curved depression in an epitaxial active layer having a nonuniform doping profile. The depression is formed by anodizing a portion of the epitaxial layer and etching the anodic oxide. Etching and electroplating of the contact are done in the same solution to avoid contamination of the metal-semiconductor interface.

1 Claim, 12 Drawing Figures

DEVICES WITH SCHOTTKY METAL CONTACTS FILLING A DEPRESSION IN A SEMI-CONDUCTOR BODY

This is a division, of application Ser. No. 770,014 filed Feb. 18, 1977 now U.S. Pat. No. 4,108,738 issued on Aug. 22, 1978.

BACKGROUND OF THE INVENTION

This invention relates to a method for making Schottky barrier semiconductor diodes and, more particularly, to low noise gallium arsenide devices suitable for use as microwave or millimeter wave frequency mixers.

Schottky barrier diodes are devices in which a rectifying junction is formed by a metal contact on a semiconductor surface. Such devices, particularly when the semiconductor is gallium arsenide, can be switched between conductive and nonconductive states at extremely high repetition rates. Thus, they are attractive for use as high frequency mixers. At high frequencies, however, it is of paramount importance that such parameters as junction capacitance, reverse bias breakdown voltage, and noise be reproducible and highly predictable.

The electrical parameters of Schottky barrier diodes are extremely sensitive to the cleanliness of the metal-semiconductor interface. In particular, contaminants can act as surface traps which degrade the ideal current-voltage characteristics of the device and also result in hysteresis effects. The surface traps also increase the diode noise. Thin layers of native oxides at the metal-semiconductor interface also tend to increase the series resistance of the junction, thus, decreasing the cutoff frequency of the device.

Greater control and reproducibility of the active semiconductor regions has been achieved by use of epitaxial growth to form the regions and by use of ion implantation to control the carrier concentration. With most epitaxial techniques, however, there has been difficulty in controllably producing thin layers and desired doping profiles. Because of outdiffusion, there has also been difficulty in depositing an epitaxial layer on a heavily doped substrate with an abrupt change in carrier concentration between the substrate and the epitaxial layer.

Another problem in making reproducible Schottky barrier diodes is the tendency for preferential reverse bias breakdown to occur at the edges of the metal contact. For this reason, guard rings and other complex structures have been used to prevent current from flowing across the edge portion of the barrier under reverse bias conditions. The edge effects are a result of an increase in the electric field concentration at the periphery of the junction. Typically, the guard rings are of the metal-insulatorsemiconductor or the p-n type. Thus, either an insulator or a region of opposite conductivity type circumscribes the edge of the junction. Unfortunately, the use of a guard ring introduces parasitic capacitance and hence decreases the cutoff frequency.

SUMMARY OF THE INVENTION

We have developed a process which produces a Schottky barrier device in which the need for a guard ring is obviated. In an illustrative embodiment, an epitaxial layer is formed on a heavily doped sibstrate, so as to have a doping or carrier concentration which decreases with distance from its interface with the substrate toward its free surface. A masking layer, preferably of silicon dioxide, is then formed on the wafer and etched to define the location of the desired Schottky barrier contact. Then, the exposed portion of the epitaxial layer is oxidized to a predetermined depth, preferably by anodization. Next, the wafer is immersed in a solution which is capable both of etching the oxide formed by anodization and depositing a metal on the semiconductor. Etching of the oxide creates a depression in the exposed epitaxial layer, and thereafter the metal layer is deposited within the depression to form a rectifying contact.

Because the wafer is immersed in the solution during both the etching and the metal deposition steps, contamination of the metal-semiconductor interface is virtually avoided. The formation of the depression insures that the major surface of the metal-semiconductor interface is located in the interior of the epitaxial layer where the doping concentration is relatively high while the peripheral portions of the interface are generally curved and taper upwardly toward the surface where the dopant concentration is relatively low. With the central portion of the contact located nearest the substrate region, the configuration of the depression and the doping profile together insure voltage punch-through at the central portion of the interface and pervent a preferential breakdown at the periphery of the metal contact.

As will be more fully appreciated later, the foregoing process yields devices having other desirable electrical characteristics, such as relatively high cutoff frequencies, relatively low noise, and other advantages deriving largely from a high degree of control obtainable from the fabrication process. The advantages are obtained by a process which is simple, relatively easy to implement, and which yields structures that are reproducible and of relatively simple configuration.

These and other objects, features, and advantages of the invention will be better appreciated from consideration of the following detailed description read in conjunction with the accompanying drawings.

DRAWING DESCRIPTION

DETAILED DESCRIPTION

Figure 1:
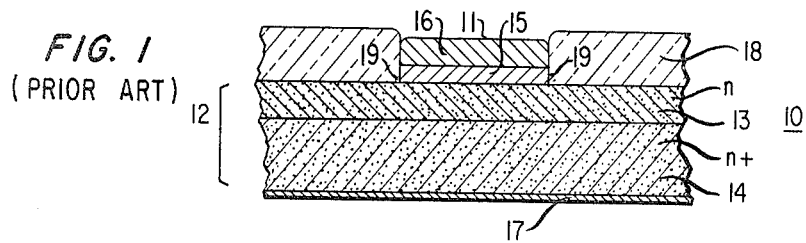
FIG. 1 is a cross-sectional view of a prior art Schottky barrier diode.

Referring to FIG. 1, there is shown a conventional millimeter-wave mixer diode 10 of the prior art comprising a Schottky barrier contact 11 formed on a semiconductor wafer 12. The wafer 12 typically comprises an n-type GaAs epitaxial layer 13 formed on an n-type substrate 14, while the contact 11 typically comprises a platinum film 15 electrodeposited on the epitaxial layer surface to give desired electrical characteristics together with a gold layer 16 formed on film 15 for structural and contacting purposes. An ohmic contact 17 is formed on the semiconductor substrate 14 opposite the Schottky barrier contact.

The prior art device is made by first forming layer 13 by a conventional epitaxy technique which gives a relatively constant doping concentration throughout. A masking layer 18, typically silicon dioxide, is deposited and etched to define a region for the electrodeposition of platinum layer 15. Gold layer 16 is then deposited over the platinum. The interface between Schottky barrier contact 11 and the semiconductor layer 13 constitutes a rectifying junction which, when reverse biased, will be nonconductive until a suitably high reverse bias breakdown voltage is reached.

Figure 5A:
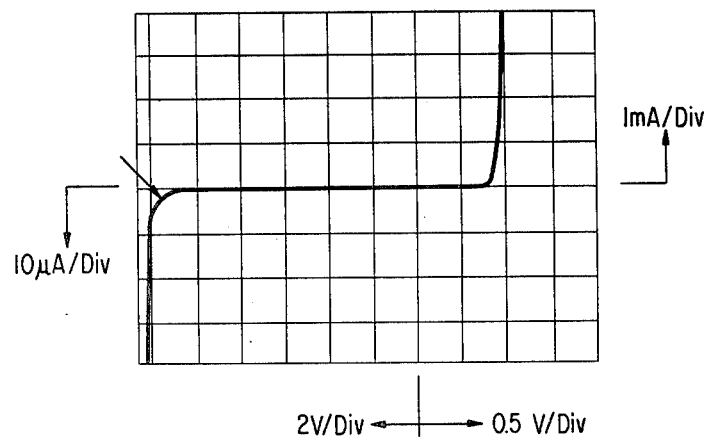
FIGS. 5A–5B show typical current-voltage characteristics for a prior art device and a device made in accordance with the invention, respectively.

Due to electric field fringing effects, electric field lines tend to be concentrated at the edges of the contact 11 when the device is reverse biased, thus giving preferential breakdown at periphery 19 of the contact. Breakdown is not always uniform, thus resulting in a "soft" voltage-current characteristic as seen at the arrow in FIG. 5A, rather than an abrupt or sharp increase in current conduction when the breakdown threshold is reached. Furthermore, small variations in processing can affect the geometry at the contact periphery, thus changing the breakdown voltage and creating problems of reproducibility.

Also, the surface of epitaxial layer 13 in the region of the masking layer 18 opening cannot be easily and perfectly cleaned before metal deposition. Known cleaning procedures leave contaminants on the surface which result in a deterioration of the ideal voltage-current characteristics of the junction. Even with careful etching, a thin native oxide of the semiconductor layer 13 is likely to be formed on the surface which causes a small hysteresis in the current-voltage characteristic.

DEVICE STRUCTURE

Figure 2:
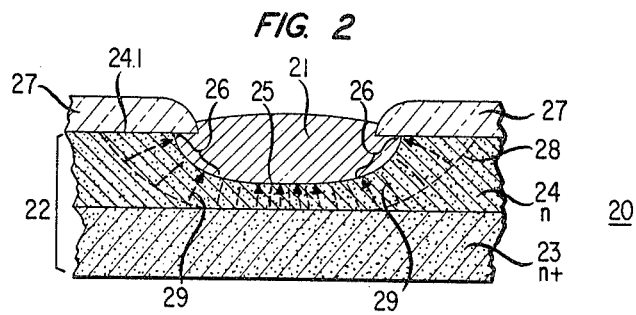
FIG. 2 is a cross-sectional view of a Schottky barrier diode made in accordance with the invention.
Figure 6:
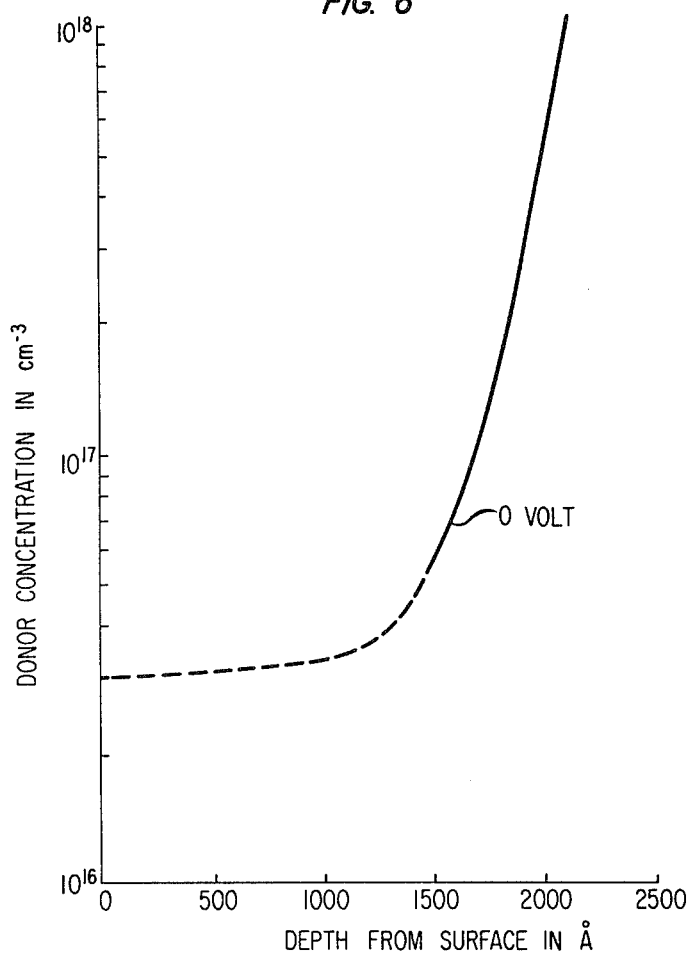
FIG. 6 is a doping profile for the epitaxial layer of a device fabricated in accordance with the invention.

Referring now to FIG. 2, there is shown a crosssectional view of a Schottky barrier diode 20 in accordance with an illustrative embodiment of the invention. A Schottky barrier metal contact 21 is disposed within semiconductor wafer 22, illustratively comprising a GaAs substrate 23 and an n-type GaAs epitaxial layer 24. While only a single layer of metal is shown as contact 21, it is preferably a platinum-gold combination as in FIG. 1. The epitaxial layer 24 has a doping concentration which increases with distance from the upper surface as shown in FIG. 6. In other words, the epitaxial layer is more highly doped at the interface with substrate 23 and is more lightly doped in a direction vertically upward on the drawing toward the free surface 24.1. A depression is formed within epitaxial layer 24 through a window in a masking layer 27 in a manner to be described in more detail below. Metal contact 21 is deposited in the depression. The configuration of the depression is such that curved peripheral portions 26 which intersect the free surface are conected by a central portion 25 which is nearest the substrate.

When the diode is reverse biased, a depletion region is formed having a boundary 28 and an electric field shown by typical electric field lines 29. Electric field lines 29 are shown to illustrate that the electric field intensity is inherently highest at the central portion 25 of metal contact 21 and decreases with distance toward peripheral portions 26. This is due both to the geometry of the contact and to the doping profile of the epitaxial layer; that is, the central portion 25 of the metal-semiconductor interface is closer to the interface between the substrate and the epitaxial layer and is located in a region of the epitaxial layer having a higher carrier concentration than is the peripheral portions 26. This higher electric field intensity insures voltage punchthrough and preferential breakdown at or near the central portion 25 of the metalsemiconductor interface and avoids breakdown at portions 26.

FABRICATION PROCESS

Figures 3A, 3B:
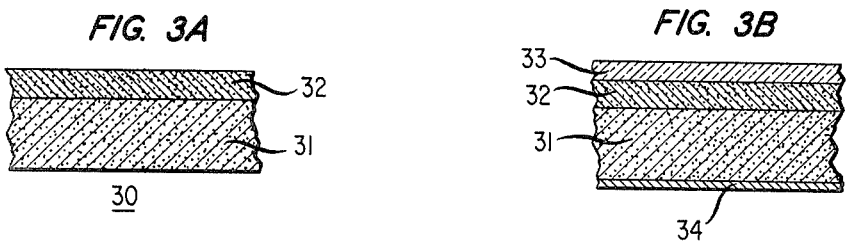
FIG. 3A–3F illustrate successive steps in the fabrication of an array of Schottky barrier diodes in accordance with the invention.
Figures 3C, 3D:
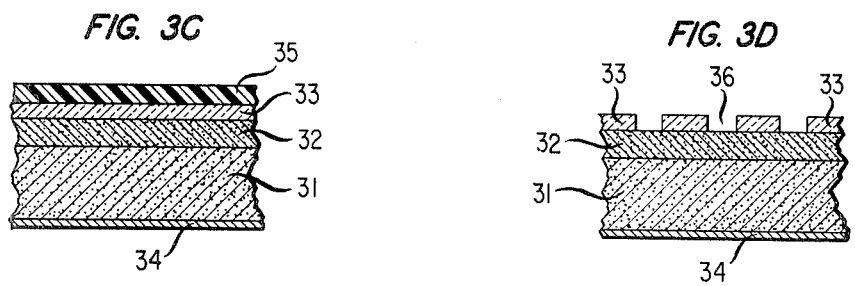
Figures 3E, 3F:
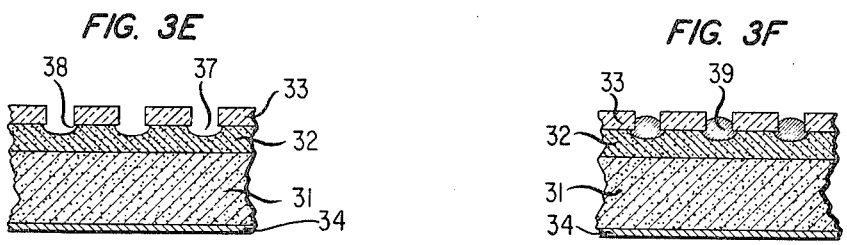
Figure 4:
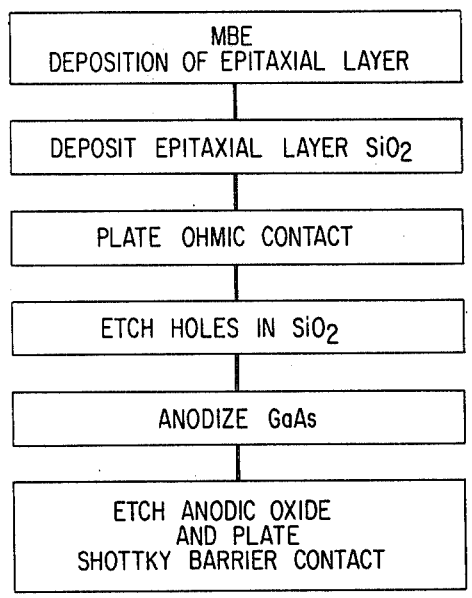
FIG. 4 is a flow chart showing a processing sequence in accordance with the invention.

FIG. 4 is a flow diagram of processing steps, in accordance with the invention, for fabricating the device of FIG. 2 or an array of such devices as shown in FIG. 3F.

Referring to FIG. 3A, a wafer 30 is shown comprising an epitaxial active layer 32 disposed on substrate 31. Wafer 30, illustratively, is a single conductivity type semiconductor. For high frequency devices, an n-type dopant such as Sn, Si, or Ge is generally used. Substrate 31 is of nt-type conductivity with a concentration on the order of $10_{18}cm^{-3}$ and has a thickness of about 0.5 mm. The doping level abruptly changes between substrate 31 and epitaxial layer 32 to the order of $10^{16}cm^{-3}$. Epitaxial layer 32 has a thickness from about 1000 to 5000 Angstroms and the doping profile concentration within layer 32 decreases with distance from the substrateepitaxial layer interface as shown in FIG. 6.

Molecular beam epitaxy (MBE) is preferably used to grow wafer 30. MBE involves a reaction of one or more thermal molecular beams with a crystalline surface under ultra high vacuum conditions. The advantage of using MBE is the very high degree of control available for thickness, composition, and doping level. A technique may be used similar to that described in U.S. Pat. No. 3,928,092 issued to W. C. Ballamy and A. Y. Cho on Dec. 23, 1975.

Referring to FIGS. 3B–3D, a passivating layer 33, such as silicon dioxide, is deposited on layer 32. Substrate 31 is preferably reduced in thickness and then an ohmic contact 34 is plated on the back side. Photoresist 35 is applied to passivating layer 33 and standard photolithographic techniques are employed to form an array of apertures 36, preferably with a circular or elliptical shape, which expose the underlying semiconductor layer 32. Photoresist 35 may be removed if desired. Next, the exposed portions of semiconductor layer 32 are anodized to a depth of several hundred to several thousand Angstroms. For GaAs, electrolytes of peroxide or water and glycol such as described in the following references are sufficient: Logan et al, *J. Electrochem. Soc.* Vol 120, p. 1385 (1973); Spitzer et al, *J. Electrochem. Soc.* Vol 122, p 397 (1975); and Hasegawa et al, *J. Electrochem. Soc.*, Vol 123, p. 713 (1976). The depth of semiconductor consumed is accurately controlled by the voltage applied. For GaAs, 13 Angstroms are consumed per applied volt and the corresponding oxide thickness is 20 Angstroms/volt.

After anodic oxidation to the desired depth, the wafer is immersed in an acidic or basic electroplating solution and subjected to ultrasonic agitation. A commercially prepared platinum bath such as PLATANEX III (Sel-Rex Co., Nutley, New Jersey) or Platinum TP solution (Technic Inc., Providence, Rhode Island) is adequate. Calibration tests are made to determine the amount of time to remove the anodic oxide as exhibited by a surface color change. As soon as the oxide is removed, a suitable voltage is applied and pulse plating begins.

Removal of the oxide creates a depression 37 within epitaxial layer 32 as shown in FIG. 3E. The oxide consumes a portion of the semiconductor material underneath the passivating layer 33 and forms overhang 38. Regardless of substrate crystal orientation, a depression having a curved surface is formed. The newly exposed semiconductor surface is never exposed to the atmosphere or other solvents once then anodic oxide is removed.

A metal contact, preferably layers of platinum and gold, is deposited into depression 37 to form a Schottky barrier contact 39 with the semiconductor layer 32 as shown in FIG. 3F. The plated metal may or may not extend above passivating layer 33. One advantage of the configuration as shown in FIG. 2 is that a whisker contact can be used. On the other hand, if the metal extends above the passivating layer, it is suitable for flip-chip or other bonding techniques. Either may, the passivating layer 33 overhangs the peripheral portions and minimizes fringe field effects, passivates, and seals the contact area.

Figure 5B:
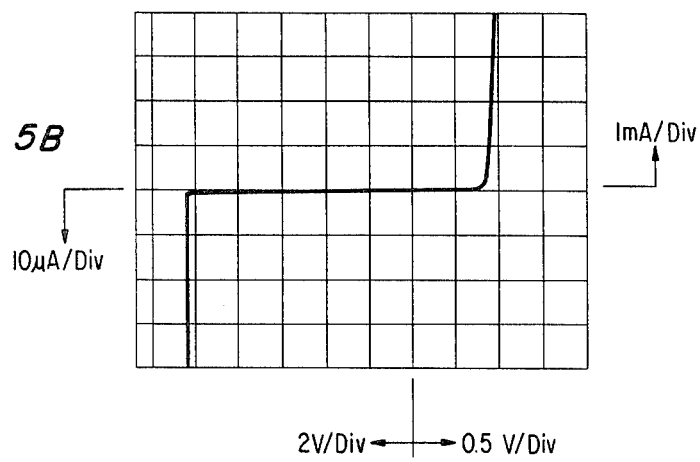

The anodizing-etching-plating sequence produces devices which have a sharp, reproducible breakdown voltage. FIG. 5B shows the current-voltage characteristic of such a device. Furthermore, punch-through is restricted to the center of the depression rather than the periphery, thereby eliminating the need for guard ring. These characteristics are derived through the high degree of control available in this technique as to the doping profile, the thickness of the epitaxial layer, the depth of the depression, the shape of the depression and the cleanliness of the metal-semiconductor interface. In addition, these factors all combine to give a relatively low noise temperature and high cutoff frequency, making the diode suitable for very sensitive high frequency work.

EXAMPLE

In an illustrative embodiment of our invention, Schottky barrier diodes were fabricated for use as cryogenically cooled millimeter-wave mixer diodes such as those described in U.S. Pat. No. 4,000,469 issued to T. F. Mc Master on Dec. 28, 1976. These high frequency devices require relatively small junction area, low diode noise temperature, and a dopant which does not exhibit carrier freezeout at low temperatures.

An MBE technique of the type described by J. R. Arthur, Jr. in U.S. Pat. No. 3,615,931 issued on Oct. 26, 1971 and by A. Y. Cho in U.S. Pat. No. 3,751,310 issued on Aug. 7, 1973 was used to fabricate wafer N-277. Basically, a GaAs substrate doped n+ was cleaned in a conventional manner and placed within a vacuum chamber. The chamber was evacuated to about $10^{-9}$ Torr and the substrate heated to a temperature of about 550 degrees C. The effusion ovens were heated so that the Ga oven was about 980 degrees C, the As oven was about 330 degrees C, and the Sn oven was about 800 degrees C, resulting in vaporization of the materials therein and the consequent formation of molecular beams. The beams were directed toward the substrate surface to deposit epitaxial layers thereon at a rate of about 6700 Angstroms/hr. A GaAs buffer layer 2 micrometers thick and doped n+ to a concentration of $2 \times 10^{18} cm^{-3}$ was deposited on the substrate. The temperature of the wafer was reduced to about 500 degrees C to prevent surface a segregation of the Sn (as described in A. Y. Cho, U.S. Pat. No. 3,941,624 issued Mar. 2, 1976), and the Sn effusion oven temperature was reduced to produce a carrier concentration on the order of $10^{16} cm^{-3}$. An epitaxial active layer of n-type GaAs about 1500 Angstroms thick was grown on the buffer layer. The doping profile of the epitaxial layer of wafer N-277 is shown in FIG. 6. The dopant concentration ranged from $3 \times 10^{16} cm^{-3}$ at the surface of the epitaxial layer to $4 \times 10^{16} cm^{-3}$ at a depth of about 400 Angstroms. Tin was chosen as the dopant since it has shallow ionization levels which prevent carrier freezeout at low temperatures.

A layer of silicon dioxide approximately 4000 Angstroms thick was deposited on the epitaxial layer surface. The wafer was then lapped to a thickness of 100 micrometers. A multilayered ohmic contact of Sn-Ni, Ni, and Au was then plated on the substrate surface. Photoresist was applied to the silicon dioxide coating and elliptical holes having a total length of 7 micrometers and a width of 2 micrometers were opened in the silicon dioxide by standard photolithographic techniques. The photoresist was then stripped off.

The exposed semiconductor in the holes was anodized to a depth of 400 Angstroms by application of 31 volts to a solution of 3% tartartic acid in 100 ml of 1:4 tartaric acid to glycol. Wafer N-277 was then subjected to an electroplating solution, PLATANEX III, a sulfamic based solution having a pH between 0.5 and 1.5. The solution was maintained at 80 degrees C and ultrasonically agitated. After the anodic oxide was removed (in 10 sec under these conditions), pulse plating was immediately begun using a capacitance discharge. A platinum layer of 1000–2000 Angstroms thick was deposited. Next, the wafer was subjected to a gold plating bath, such as Puragold or Autronex (Oxy-Metal Industries Corp., Nutley, New Jersey) and a gold layer of 2000–4000 Angstroms thick was deposited.

FIG. 5B shows the current-voltage characteristic of the resultant diode. Sharp reverse bias breakdown was reproducibly obtained at 10.2 volts. The following electrical properties were measured: series resistance, 10.5 ohms; junction capacitance, 9.5 femtofarads; punch-through voltage, 2 volts; ideality factor, 1.07; and cutoff frequency, 1.68 GHz.

It is to be understood that the above-described examples are merely illustrative of the many possible specific embodiments which can be devised to represent application of the principles of the invention. Numerous and varied arrangements can be devised with these principles by those skilled in the art without departing from the spirit and scope of the invention. In particular, the process would be applicable to the manufacture of other semiconductor devices requiring a sharp, reproducible reverse bias breakdown such as clamped transistors, varactors, IMPATT diodes, avalanche photodetectors, Gunn diodes, PIN switches, etc. It is also applicable to semiconductors other than GaAs; specifically, it has been used with indium phosphide, and may be used with silicon and indium arsenide.

What is claimed is:
1. A semiconductor device comprising:
 (a) a GaAs substrate doped with Sn to a concentration on the order of $10^{18} cm^{-3}$;
 (b) an ohmic contact disposed on a major surface of said substrate;
 (c) a GaAs epitaxial layer about 1500Å thick disposed on an opposite major surface of said substrate and being doped with Sn to a concentration with abruptly changes from about $10^{18} cm^{-3}$ at the interface with said substrate to the order of $10^{16} cm^{-3}$ in said epitaxial layer and decreases with distance from said interface to the free surface of said layer;

(d) a passivating layer disposed on said free surface and having an aperture therein to expose a portion of said epitaxial layer;

(e) a depression in said epitaxial layer underneath said aperture extending under at least a portion of said passivating layer, said depression having a generally curved profile including peripheral curved portions which intersect said free surface and a central portion having a depth of about 400Å which joins said peripheral portions, the distance between said central portion of said depression and said interface being sufficiently small to allow voltage punch-through under conditions of reverse bias, the carrier concentration in said epitaxial layer decreasing from about $4 \times 10^{16} \text{cm}^{-3}$ at a depth of about 400Å from said free surface to about $3 \times 10^{16} \text{cm}^{-3}$ at said free surface, the carrier concentration near said free surface being sufficiently small to prevent breakdown at the intersection of said curved portions with said free surface under conditions of reverse bias, and the curved shape of said depression and the carrier concentration being mutually adapted to confine reverse bias breakdown to said central portion of said depression; and (f) a metal filling said depression and forming a Schottky barrier contact with said epitaxial layer.

* * * * *